United States Patent [19]

Andrus et al.

[11] 4,063,154

[45] Dec. 13, 1977

[54] D. C. ELECTROMETER

[75] Inventors: Paul G. Andrus, Powell; James M. Hardenbrook, Columbus, both of Ohio

[73] Assignee: Xerox Corporation, Stamford, Conn.

[21] Appl. No.: 744,912

[22] Filed: Nov. 26, 1976

[51] Int. Cl.² .............................................. G01R 5/28
[52] U.S. Cl. ..................... 324/32; 324/109; 324/72; 355/14
[58] Field of Search ................ 324/32, 72, 72.5, 109; 355/3 R, 16, 14

[56] References Cited

U.S. PATENT DOCUMENTS

| | | | |
|---|---|---|---|
| 3,753,102 | 8/1973 | Beck | 324/109 |
| 3,851,247 | 11/1974 | Vosteen et al. | 324/72 |
| 3,887,877 | 6/1975 | Vosteen | 324/72 X |
| 3,935,531 | 1/1976 | Slomcenski | 324/72 |

*Primary Examiner*—Rudolph V. Rolinec
*Assistant Examiner*—Vincent J. Sunderdick

[57] ABSTRACT

Feedback circuit for the probe of an d.c. type electrostatic voltmeter to reduce spacing sensitivity thereof. A variable gain amplifier is employed to control the amplitude of the a.c. signal output of a square wave oscillator in response to the potential sensed by the probe. The a.c. signal output drives a high voltage transformer, the output of which is rectified to provide a d.c. signal output matching the potential sensed by the probe. The d.c. output is returned to the probe housing to bias the housing to a potential equal to the potential read by the probe. A sample and hold circuit enables readout of the d.c. signal output.

2 Claims, 3 Drawing Figures

D. C. ELECTROMETER

This invention relates to electrostatic reproduction machines, and more particularly to an improved electrostatic voltmeter for use with such machines.

As will be understood by those skilled in the art, satisfactory operation of the highly complex and sophisticated present day electrostatic copying or reproduction machines depends to a great degree on the ability of the machine field service personnel to adjust the machine components for optimum performance. Many adjustments and settings in the machine are interrelated such that too extreme an adjustment to one machine component may be detrimental to the effective operation of another machine component or components.

One tool that has proved useful in servicing machines of this type is an electrostatic voltmeter, commonly termed an electrometer. The electrometer, which has the ability to measure electrostatic charge levels on the machine photoreceptor without touching the photoreceptor surface, is used by the service personnel to read the charge on the photoreceptor at some convenient point or points and on the basis of such reading or readings, to enable accurate adjustments of certain components affecting the charge level i.e. the charging corotron, exposure duration, developer bias, etc to be made.

Electrometers for the use alluded to above are of two principal types, an a.c. type or d.c. type. In the a.c. type, an alternating signal, which incorporates a reference base, is generated by the probe element which views or scans the photoreceptor surface. This type of signal may be created for example by a rotating shutter or vane designed to periodically expose the photoreceptor surface being measured to the probe during scanning. The resulting a.c. signal is then processed to provide an appropriate readout. However, while effective, a.c. type electrometers are normally more expensive than d.c. type electrometers.

In d.c. type electrometers, a constant signal output, i.e. a direct current signal, representative of the charge on the photoreceptive surface being viewed, is produced. D.C. type electrometers, although less expensive, unfortunately suffer from a number of problems which reduces their attractiveness for this type of application. One is a pronounced sensitivity to the spacing, i.e. distance, between the probe and the surface of the photoreceptor. This problem is often compounded by the capacitance effect created in which the electrometer probe is in effect one plate of a capacitor while the photoreceptor surface is the other. In addition, d.c. type electrometers have been found to have a tendency to drift after short periods of time rendering the readings taken inaccurate.

It is therefore a principal object of the present invention to provide a new and improved d.c. type electometer.

It is a further object of the present invention to provide an improved electrometer having reduced spacing sensitivity.

It is a further object of the present invention to provide a d.c. type electrometer incorporating means to neutralize changes in spacing between the electrometer probe and the surface being measured.

It is an object of the present invention to provide a d.c. electrometer for use with electrostatic type copiers incorporating a feed back circuit to the electrometer probe structure to neutralize spacing sensitivity.

This invention relates to a d.c. type electrostatic voltmeter for measuring charge potentials on a xerographic plate, comprising in combination, a probe to be disposed opposite the xerographic plate and in spaced relationship thereto, a housing for the probe; first control means; means for applying the d.c. signal output of the probe to the first control means whereby the first control means provides a control signal proportional to the probe signal; an a.c. signal source; second control means for regulating the amplitude of the signal produced by the a.c. signal source in response to the control signal whereby to provide an a.c. signal having an amplitude proportional to the probe signal; power transformer means; third control means for driving the power transformer means in response to the signal from the a.c. signal source; rectifying means for rectifying the a.c. output of the power transformer whereby to provide a d.c. signal having a potential substantially equal to the potential on the xerographic plate, and means for applying the d.c. signal output of the rectifying means to the probe housing to null the voltage gradient between the xerographic plate and the probe housing and render the probe substantially spacing insensitive.

Other objects and advantages will be apparent from the ensuing description and drawings in which.

Figure 1:
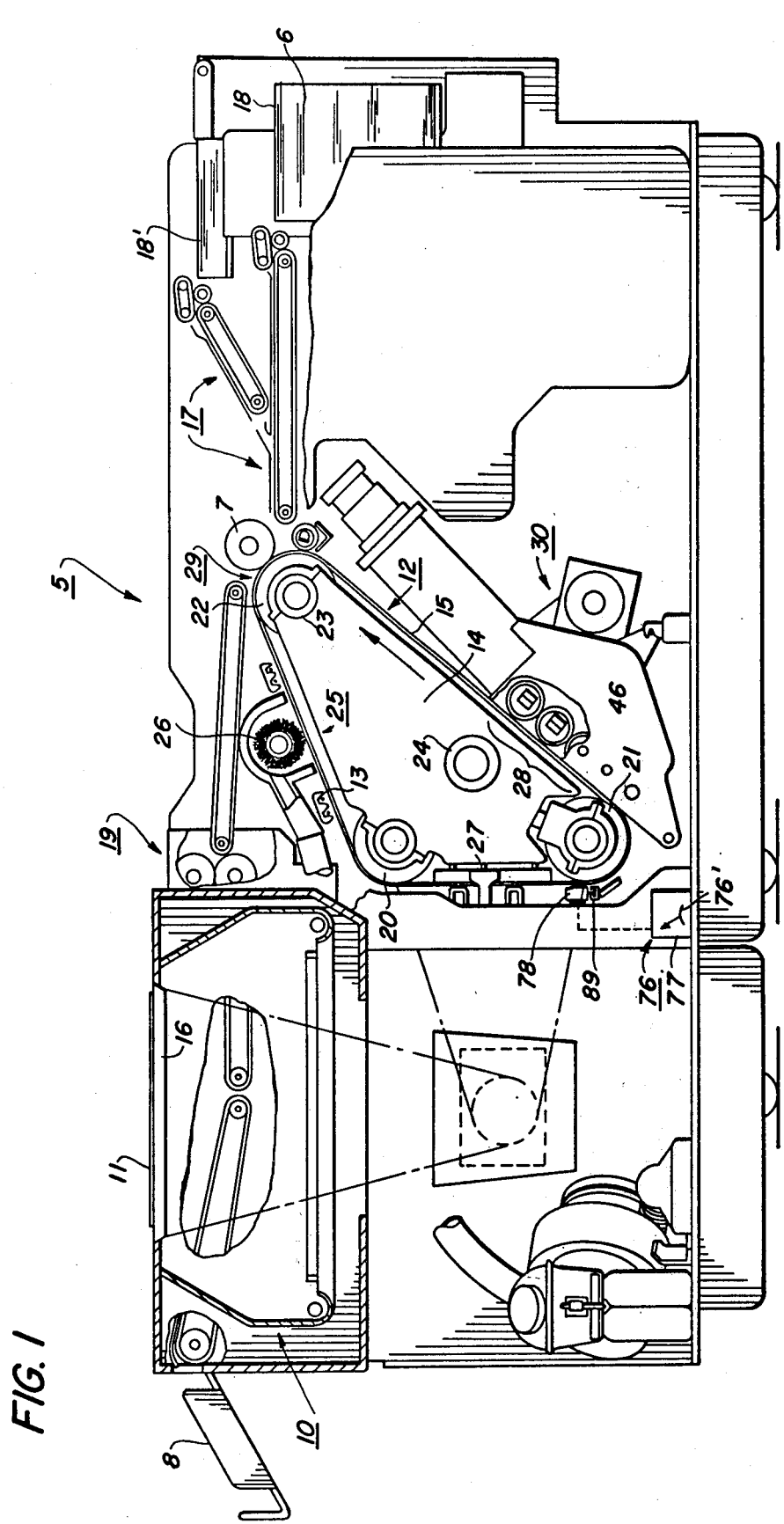
FIG. 1 is a schematic sectional view of an electrostatic reproduction machine with which the electrometer of the present invention is usable.

For a general understanding of the invention, an exemplary copier/reproduction machine in which the invention may be incorporated, is shown in FIG. 1. The reproduction or copying machine, is there designated generally by the numeral 5.

A document 11 to be copied is placed upon a transparent support platen 16 fixedly arranged in an illumination assembly, generally indicated by the reference numeral 10, positioned at the left end of the machine 5. Light rays from an illumination system are flashed upon the document to produce image rays corresponding to the information areas. The image rays are projected by means of an optical system onto the photosensitive surface of a xerographic plate in the form of a flexible photoconductive belt 12 arranged on a belt assembly, generally indicated by the reference numeral 14.

The belt 12 comprises a photoconductive layer 15 of selenium which is the light receiving surface and imaging medium for the apparatus, on a conductive backing. The surface of the photoconductive belt is made photosensitive by a previous step of uniformly charging the same by means of a corona generating device or corotron 13.

The belt is journaled for continuous movement upon three rollers 20, 21 and 22 positioned with their axes in parallel. The photoconductive belt assembly 14 is slidably mounted upon two support shafts 23 and 24, with the roller 22 rotatably supported on the shaft 23 which is secured to the frame of the apparatus and is rotatably driven by a suitable motor and drive assembly (not shown) in the direction of the arrow at a constant rate. During exposure of the belt 12, the reflected light image of the original document 11 positioned on the platen is flashed on the surface 15 of belt 12 to produce an electrostatic latent image thereon at exposure station 27.

The electrostatic latent image on the moving belt 12 passes through a developing station 28 in which there is positioned a magnetic brush developing apparatus, generally indicated by the reference numeral 30, and which provides development of the electrostatic image by means of multiple brushes as the same moves through the development zone, as more fully hereinafter described.

The developed electrostatic image is carried on belt 12 to transfer station 29 whereat a sheet 6 of copy paper is fed between transfer roller 7 and belt 12 at a speed in synchronism with the moving belt to transfer the developed image to sheet 6 without blurring. A sheet transport mechanism, generally indicated at 17, brings sheets 6 from paper supply tray 18 or 18' to the transfer station 29 at the proper time to match the arrival of the sheet with the arrival of the developed image on belt 12.

Following transfer, the image bearing sheet is separated from belt 12 and conveyed to a fuser assembly, generally indicated by the reference numeral 19, wherein the developed powder image on the sheet is permanently affixed thereto. After fusing, the finished copy is discharged from the apparatus into a suitable collector, i.e. tray 8. Residual toner particles and any other residue left on belt 12 are removed by brush 26 at cleaning station 25. Further details regarding the structure of the belt assembly 14 and its relationship with the machine and support therefor may be found in U.S. Pat. No. 3,730,623, issued May 1, 1973 and assigned to the same assignee.

As will be understood by those skilled in the art, development of the latent electrostatic image formed on belt 12 is dependent upon the voltage differential between the light image and the developing means. This voltage differential, which may be described as a xerographic development field, serves to attract toner to the latent electrostatic image in accordance with the image outline and density requirements to faithfully reproduce the original being copied. The strength and make-up of the xerographic development field may change with machine use and age.

To insure optimum machine performance, both initially and during the machine service life, adjustment or tuning of those machine processing components affecting the strength and make-up of the xerographic development field may be made. Such servicing may include adjusting of the power input to the corona generating device 13, adjusting the voltage bias level on magnetic brush sleeves 46, resetting the bias on the developing electrode or electrodes in an electroded developing system, etc.

The above adjustments may be performed manually and are normally performed by the machine technical or service representative who conveniently employs an electostatic voltage measuring device. commonly termed an electrometer, designated herein by the numeral 76. Electrometer 76 which consists of a main body 77 and remote probe 78 operably interconnected by suitable electrical leads as will appear more fully herein, measures the voltage or potential on a surface. In the present application, electrometer 76 measures the charge on the surface of belt 12. Electrometer 76 may include a meter 76' to indicate visually the voltage being read. Alternately, an automatic control may be provided wherein the output of the probe 78 to electrometer 76, reflecting the voltage level of the area measured, i.e., belt 12 is used to adjust the power input or bias to one or more of the machine process components such as described above.

Figure 2:
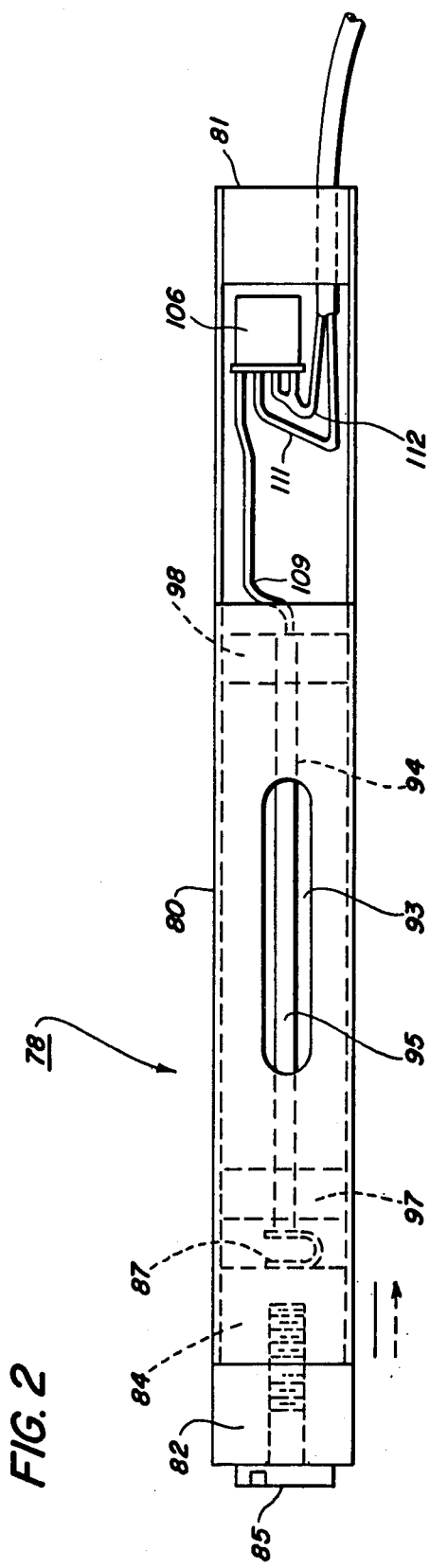
FIG. 2 is a plane view showing details of the electrometer probe.

Referring to FIG. 2, electrometer probe 78 includes a hollow generally cylindrical housing 80. Housing 80 is formed from a suitable rigid conductive material normally metal. End plugs 81, 82, normally of electrical insulating material, close off the terminal ends of housing 80. Plug 81, the diameter of which is slightly greater than the inner diameter of housing 80 to prevent relative movement, has signal output and feedback leads 111, 112 respectively projecting therethrough. Plug 82 is preferably provided with an outer dimension equal to or slightly less than the inner dimension of housing 80 to permit movement thereof relative to housing 80 in an axial direction. A conductive member 84 is attached to the inside wall of plug 82 by screw 85. Member 84 serves upon inward movement of plug 82 (in the direction of the solid line arrow) to contact conductor 87 projecting from probe element 94 to ground probe element 94 to the metal housing 80. Withdrawal of plug 82 breaks contact between member 84 and conductor 87 to interrupt grounding of probe element 94.

Conductive member 84 cooperates with conductor 87 to in effect form a switch for grounding probe element 94. This permits the probe element 94 to be shorted to remove spurious charges therefrom prior to use and to protect transistor 106 against voltage surges during storage and non-use.

The periphery of housing 80 has an elongated aperture 93 therein. The wire-like probe element 94 is disposed within housing 80 with a segment 95 thereof across aperture 93, probe element 94 extending in the direction substantially paralleling aperture 93. Probe element 94 is supported in housing 80 in spaced relationship thereto by insulators 97, 98 adjacent each end thereof. Insulators 97, 98 serve to electrically isolate probe element 94 from the adjoining portions of the conductive housing 80.

Transistor 106, which preferably comprises a depletion mode F.E.T. is disposed within the probe housing 80. Output lead 109 of probe element 94 feeds the probe output to transistor 106. Signal output and feedback leads 111, 112 respectively couple probe 78 with the main electrometer body 77 and the electrometer operating circuit 125 housed therewithin.

Figure 3:
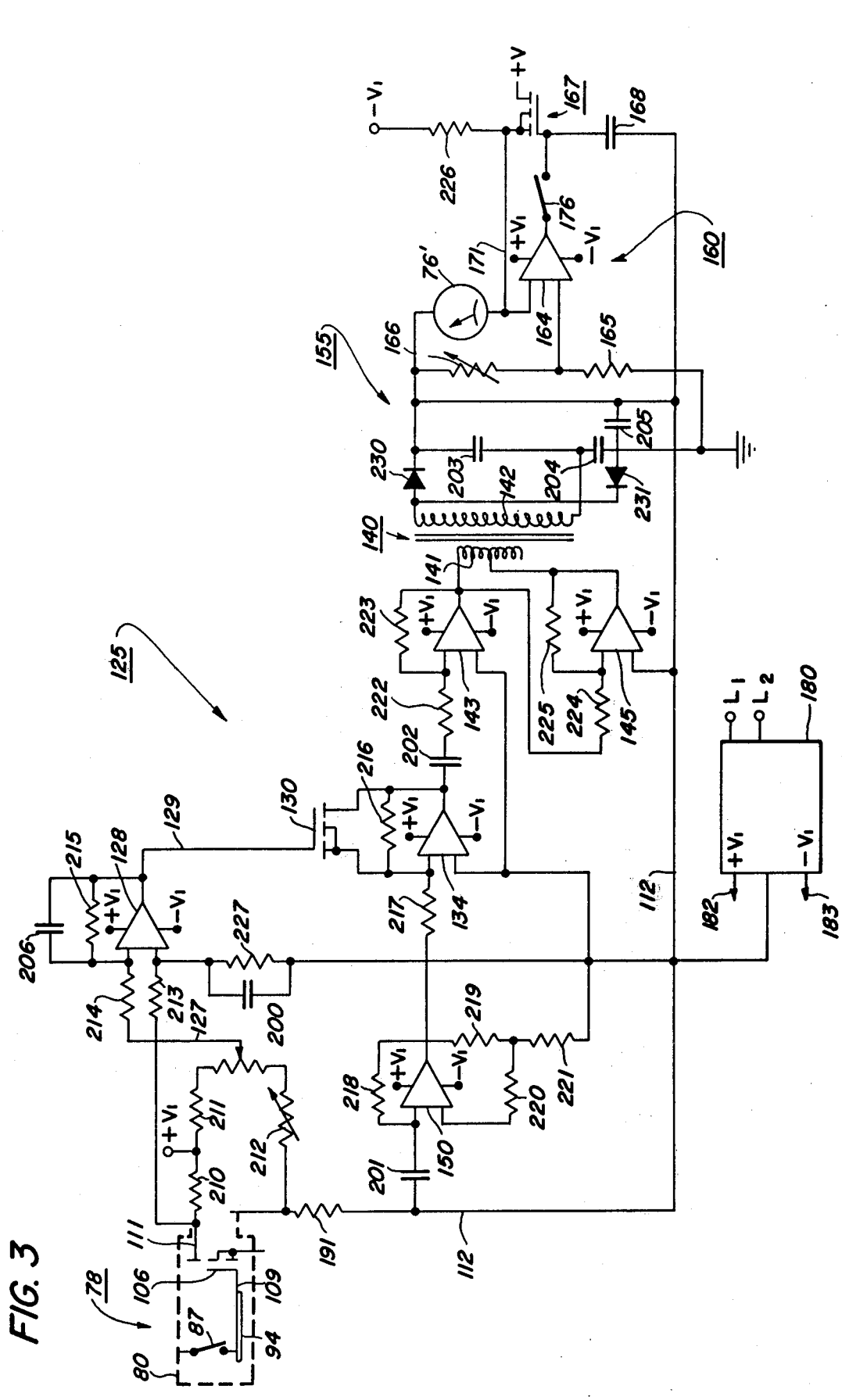
FIG. 3 is a schematic of the electrometer feedback circuit of the present invention.

Referring particularly to FIG. 3 of the drawings, electrometer operating circuit 125 thereshown is housed within the electrometer main body 77. Leads 111, 112 which electrically couple probe 78 with circuit 125, are of sufficient length to permit probe 78 to be moved into and out of operating position relative to belt 12.

The output of transistor 106 is fed via lead 111 to a differential input operational amplifier 128. The output of amplifier 128, which appears in lead 129, works through transistor 130 to control the gain of operational amplifier 134. Amplifier 134 regulates the amplitude of the a.c. signal applied via operational amplifier pair 143, 145 to the primary winding 141 of high voltage transformer 140.

The a.c. signal input to amplifier 134 is derived from operational amplifier 150 connected as an oscillator. As will be understood by those skilled in the art, a square wave a.c. signal output is produced by amplifier 150.

Transformer 140 comprises a driver to push-pull, type transformer, transformer 140 being connected in reverse using one-half of the push-pull winding 141 as the primary winding. The high voltage a.c. developed across the secondary winding or output winding 142 of transformer 140 is rectified by voltage doubler circuit 155. The output of voltage doubler circuit 155 is to feedback lead 112. Lead 112 is coupled through resistor 191 to the housing 80 of probe 78 to bias the probe housing to a potential equal to the charge potential of photoconductive belt 12 as seen by probe 78. This renders probe 78 substantially insensitive to variations in the spacing between probe 78 and the surface being measured, i.e. belt 12.

To permit the feedback voltage, which is equal to the potential on the photoconductive surface 15 of belt 12 as determined by probe 78, to be read by meter 76', the output of voltage doubler circuit 155 is fed to a hold circuit 160 consisting of operational amplifier 164; a voltage divider comprising resister 165 and potentiometer 166; transistor 167; and holding capacitor 168.

Amplifier 164 is connected as a voltage follower with transistor 167 in the feedback loop 171. Meter 76' comprises a suitable voltage measuring meter, i.e. a voltmeter for reading the voltage feedback to the input of amplifier 164. A control switch 176 is provided in the output lead of amplifier 164.

A suitable low voltage d.c. power source 180 provides the requisite positive ($+V_1$) and negative ($-V_1$) working voltages for the circuit components through leads 182, 183 respectively. Power source 180 may comprise any suitable a.c. rectifier such as that illustrated in copending application Ser. No. (525,23), filed Nov. 19, 1974, now U.S. Pat. No. 4,006,267 issued Feb. 1, 1977, in the name of R. Buchheit.

The following components and values are utilized in the electrometer operating circuit 125.

| PART | MODEL NO. | MFG. |
| --- | --- | --- |
| Amplifiers 128,134,143 145, 150, 164 | 741 | NATIONAL SEMI-CONDUCTOR |
| Transistor 111 | 3N153 (FET) | RCA |
| Transistors 130, 167 | 2N4351 (MOSFET) | MOTOROLA |
| Transformer 140 | TY25X | TRIAD |
| Power Supply 180 | MD-10C | PMC |
| Diodes 230, 231 | MR-992A | MOTOROLA |
| CAPACITORS | CAPACITANCE | |
| 168, 205 | 0.01 UF at 1KV | CENTRALAB |
| 200 | 100 PF | CENTRALAB |
| 201, 202 | 0.01 UF | CENTRALAB |
| 206 | 0.1 UF | CENTRALAB |
| 203, 204 | 0.005 UF | CENTRALAB |
| RESISTORS | OHMS | |
| 165, 215, 227 | 10 M | OHMITE |
| 166 | 50 K | OHMITE |
| 191, 216, 217, 219 223, 224, 225 | 1 M | OHMITE |
| 210, 213, 214, 220 | 10 K | OHMITE |
| 211 | 2 K | OHMITE |
| 212 | 5 K | OHMITE |
| 218, 222 | 220 K | OHMITE |
| 221 | 100 K | OHMITE |
| 226 | 3.9 K | OHMITE |

In operation, where it is desired to measure the charge potential on the photoconductive surface 15 of belt 12, probe 78 of electrometer is placed opposite to the belt surface 15 at the point where measurement is desired. Preferably the space or distance between the surface 15 of belt 12 and probe 78 is in the range of from 0.3 inch to 0.4 inch.

Readings of the charge potential of the photoconductive surface of belt 12 may be made at a number of places. For example, where it is desired to determine the charging effectiveness of corona generating device 13, probe 78 is disposed opposite belt 12 at some convenient point between the corona generating device 13 and exposure station 27, probe 78 being arranged so that aperture 93 thereof faces the belt surface 15. Other dispositions of probe 78 may be envisioned.

Prior to placing probe 78 in the position selected for measurement, plug 82 is drawn outwardly (in the direction shown by the dotted line arrow in FIG. 2) to separate conductive member 84 from conductor 87 to break the ground connection between probe element 84 and the probe housing 80. Additionally, electrometer power supply 180 is actuated as by closure of a suitable electrometer on/off switch (not shown).

With probe 78 of electrometer 76 disposed in the position selected opposite photoconductive belt 12, and switch 176 of electrometer circuit 125 closed, the voltage induced on probe element 93 due to the capacitive relationship between the photoconductive surface 15 of belt 12 and the probe element 93 spaced therefrom provides a signal input in lead 127 to amplifier 128. The resulting output signal from amplifier 128 regulates the amplitude of the a.c. signal output of amplifier/oscillator 150 to provide a corresponding a.c. signal input via amplifier pair 143, 145 to high voltage transformer 140. The high voltage output of transformer 140 is rectified by voltage doubler circuit 155 to provide in lead 112 a d.c. feedback signal at a potential equal to the potential on the belt surface 15 as read by probe 78. Lead 112 applies the resulting d.c. feedback signal to housing 80 of probe 78 to in effect, null the probe and obviate or reduce the sensitivity of probe 78 to variations in the distance between probe 78 and the belt surface 15.

With control switch 176 closed, voltmeter 76' follows the voltage which is being fed back to the probe housing 80. On opening switch 176, the gate of transistor 167 is held at the feedback potential existing at the instant switch 176 is opened by capacitor 168. This causes the voltage feedback to amplifier 164 to hold and be read by voltmeter 76'.

Following the last measurement, probe 78 of electrometer 76 is removed. Plug 82 is pushed inward (in the direction of the solid line arrow in FIG. 2) to bring conductive member 84 into contact with conductor 87 to again ground probe element 63.

What is claimed is:

1. In a d.c. type electrostatic voltmeter for measuring charge potentials on a xerographic plate, the voltmeter including a probe to be disposed opposite the xerographic plate and is spaced relationship thereto and a housing for the probe, the combination of:
   a. first control means;
   b. means for applying the d.c. signal output of said probe to said first control means whereby said first control means provides a control signal proportional to said probe signal;
   c. an a.c. signal source;
   d. second control means for regulating the amplitude of the signal produced by said a.c. signal source in response to said control signal whereby to provide a regulated a.c. signal having an amplitude proportional to said probe signal;
   e. power transformer means;
   f. third control means for driving said power transformer means in response to said regulated a.c. signal:
   g. means for rectifying the a.c. output of said power transformer means whereby to provide a d.c. signal having a potential substantially equal to the potential on said xerographic plate; and h. means for applying said d.c. signal output of said rectifying means to said probe housing to null the voltage gradient between said xerographic plate and said probe housing and render said probe substantially spacing insensitive.

2. The d.c. voltmeter of claim 1 including means for reading the potential of said d.c. signal whereby to enable the voltage on said plate to be determined.

* * * * *